United States Patent [19]

Ehlers et al.

[11] 4,034,234
[45] July 5, 1977

[54] SWITCHING MODULE FOR SOLID-STATE KEYBOARD

[75] Inventors: Brian C. Ehlers, Barrington; Henry J. Boulanger, Cumberland, both of R.I.

[73] Assignee: Texas Instruments Incorporated, Dallas, Tex.

[22] Filed: Jan. 10, 1975

[21] Appl. No.: 535,893

[52] U.S. Cl. .......................... 307/116; 200/DIG. 1; 340/365 C; 361/288
[51] Int. Cl.² .................................... H01H 35/00
[58] Field of Search ............. 307/116; 200/DIG. 1, 200/159 A, 159 B; 317/249 R, 249 PB, 246, DIG. 2; 340/365 C

[56] References Cited

UNITED STATES PATENTS

| | | | |
|---|---|---|---|
| 2,452,799 | 11/1948 | Speaker et al. | 317/246 |
| 3,653,038 | 3/1972 | Webb et al. | 317/249 PB |
| 3,659,163 | 4/1972 | Borison et al. | 317/249 PB |
| 3,671,822 | 6/1972 | Leno | 317/249 R |
| 3,760,243 | 9/1973 | Perouky | 200/DIG. 1 |

*Primary Examiner*—David Smith, Jr.
*Attorney, Agent, or Firm*—John A. Haug; James P. McAndrews; Harold Levine

[57] ABSTRACT

A switching module for a solid-state keyboard or the like comprising an actuating key manually movable between a first and a second position and a variable capacitor. The capacitor has a rigid stationary electrode and another electrode movable toward and away from the stationary electrode between a first position in which the electrodes are separated by an air gap and a second position in which the air gap is substantially eliminated for effecting a change in capacitance of the variable capacitor. The movable electrode has a rigid dielectric member secured thereto on its side toward the stationary electrode, this dielectric member having a dielectric constant substantially greater than air. The switching module further comprises a cam coupling the actuating key and the movable electrode for effecting movement of the movable electrode and the dielectric member between their first and second positions in response to movement of the actuating key between its first and second positions.

11 Claims, 6 Drawing Figures

SWITCHING MODULE FOR SOLID-STATE KEYBOARD

BACKGROUND OF THE INVENTION

This invention relates to a switching module and more particularly to a switching module for a solidstate keyboard.

In mechanical switching modules conventionally used in calculator keyboards or the like, singlepole, single-throw (SPST) momentary switches are utilized as keyboard switches. In the event the mechanical switch contacts of these switches do not make good electrical contact with one another when the switch is closed, no signal will be generated for effecting operation of the calculator. It has been found that under some operating conditions, dust particles between the contacts or other contaminants, such as an oxide coating on the contacts, may prevent them from closing a circuit. Thus, even though the keyboard pushbutton is properly depressed, a desired signal may not be generated and the calculator may fail to function properly.

SUMMARY OF THE INVENTION

Among the several objects of this invention may be noted the provision of the switching module for a solid-state keyboard which does not require switching elements to make either electrical or physical contact with one another; the provision of such a switching module in which solid-state electronic devices are triggered by a change in capacitance; the provision of such a switching module which is manually operable, as by a pushbutton, and in which a change in capacitance of the switching module is positively effected upon the release of the pushbutton; the provision of such a switching module which is of relatively compact size allowing a plurality of these modules to be arranged in a keyboard array; and the provision of such a switching module which has a minimum number of parts and is thus economical to manufacture and reliable in operation. Other objects and features of this invention will be in part apparent and in part pointed out hereinafter.

Briefly, a switching module of this invention comprises an actuating key manually movable between a first and a second position. The module further includes a variable capacitor having a rigid stationary electrode and another electrode movable toward and away from the stationary electrode between a first position in which the electrodes are separated by an air gap and the second position in which the air gap is substantially eliminated for effecting a change in capacitance of the variable capacitor. The movable electrode has a rigid dielectric member secured thereto on its side toward the stationary electrode, this electrode member having a dielectric constant substantially greater than air. The switching module further comprises means coupling the actuating key and the movable electrode for effecting movement of the movable electrode and the dielectric between their first and second positions in response to movement of the actuating key between its first and second positions.

BRIEF DESCRIPTION OF THE DRAWINGS

Corresponding reference characters indicate corresponding parts throughout the several view of the drawings.

BRIEF DESCRIPTION OF A PREFERRED EMBODIMENT

Figure 1:
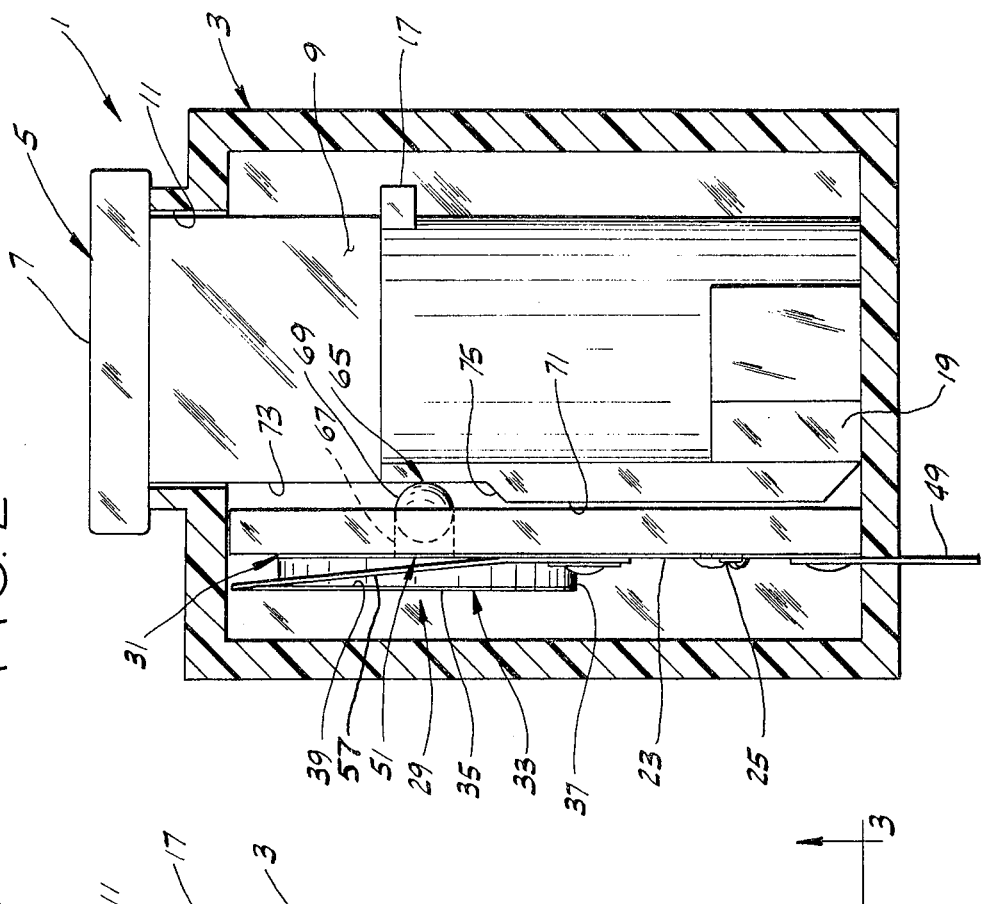
FIG. 1 is an enlarged vertical cross sectional view of a switching module of this invention illustrating a pushbutton key and a variable capacitor in their respective first positions.
Figure 2:
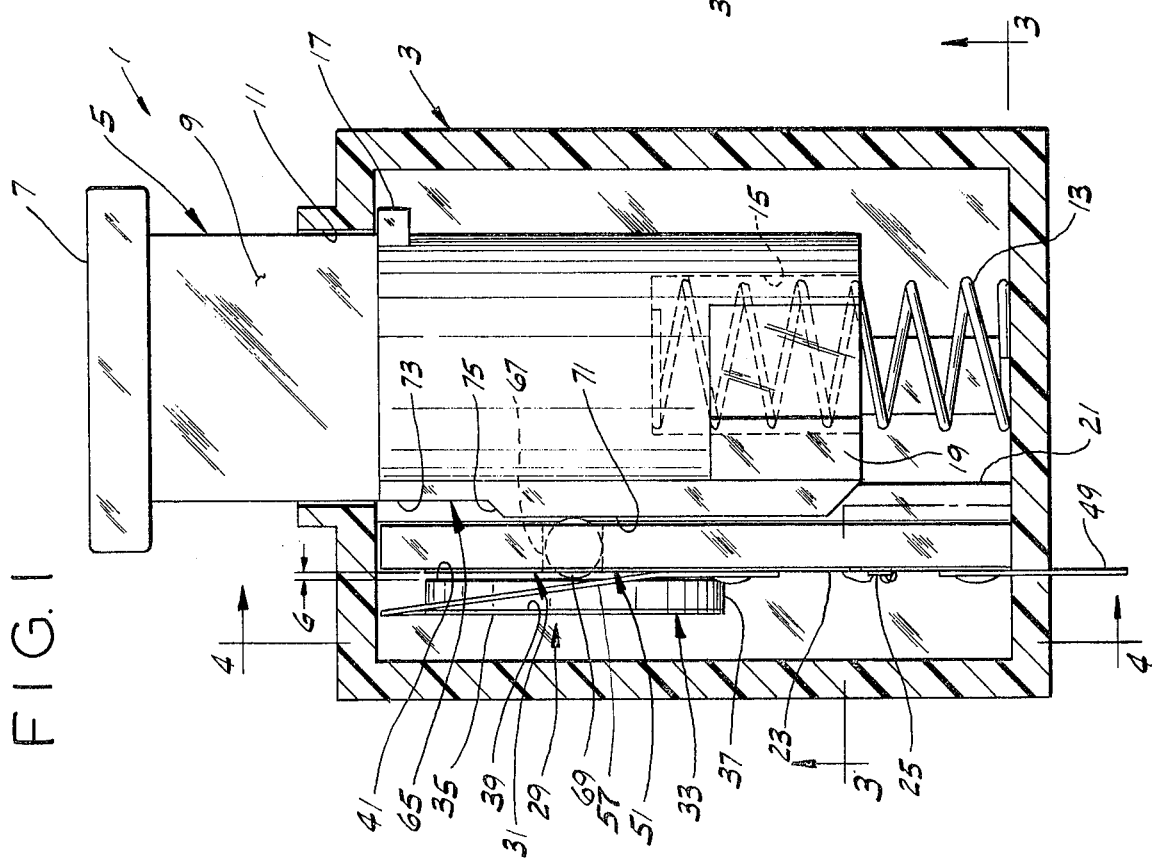
FIG. 2 is a view similar to FIG. 1 illustrating the pushbutton key and the variable capacitor in their respective second positions.
Figure 3:
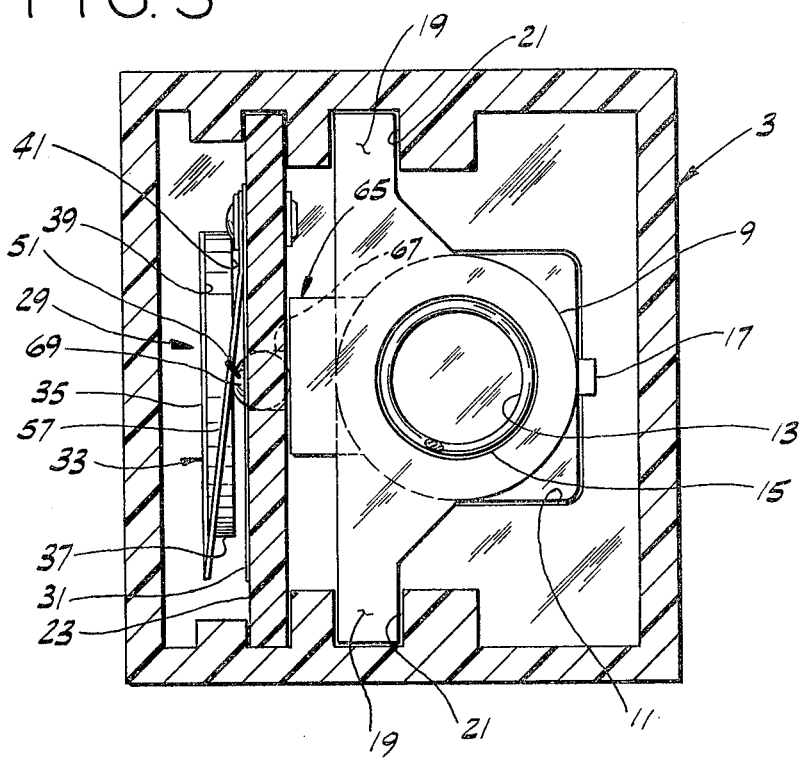
FIG. 3 is a horizontal cross sectional view taken along line 3—3 of FIG. 1.

Referring now to the drawings, a switching module for a solid-state keyboard of this invention is indicated in its entirety at 1. This switching module comprises a housing 3 which may be secured to a base (not shown), such as a keyboard base on which a plurality of these switching modules are arranged in an array. A pushbutton key 5 is carried by housing 3 for manual axial movement relative to the housing between a first or unactuated position (as shown in FIG. 1) or a second or actuated position (as shown in FIG. 2). Pushbutton key 5 has an enlarged key top 7 manually depressible by one's finger tip and a body portion 9 received within an aperture 11 in housing 3. This aperture has a relatively close sliding fit with body 9 and serves as an upper guide for the key as it is axially moved between its first and second positions. A compression coil spring 13 is received within a blind axial opening 15 in the lower end of body 9. This spring extends beyond the lower end of body 9 and engages the bottom of housing 3, thereby to resiliently bias the key toward its first or unactuated position. A lug 17 projects outwardly from cylindric body 9 and engages the inner face of housing 3 adjacent aperture 11 thereby to prevent outward movement of the key beyond its first position. As best shown in FIG. 3, guide lugs 19 project outwardly from the lower end of body 9 and are received in respective guide channels 21 formed in housing 3. These guide channels have a close sliding fit with lugs 19 and thus insure that key 5 is maintained in axial alignment with aperture 11 as the key is manually depressed to its actuated position and as it is resiliently returned to its unactuated position by spring 13.

Figure 4:
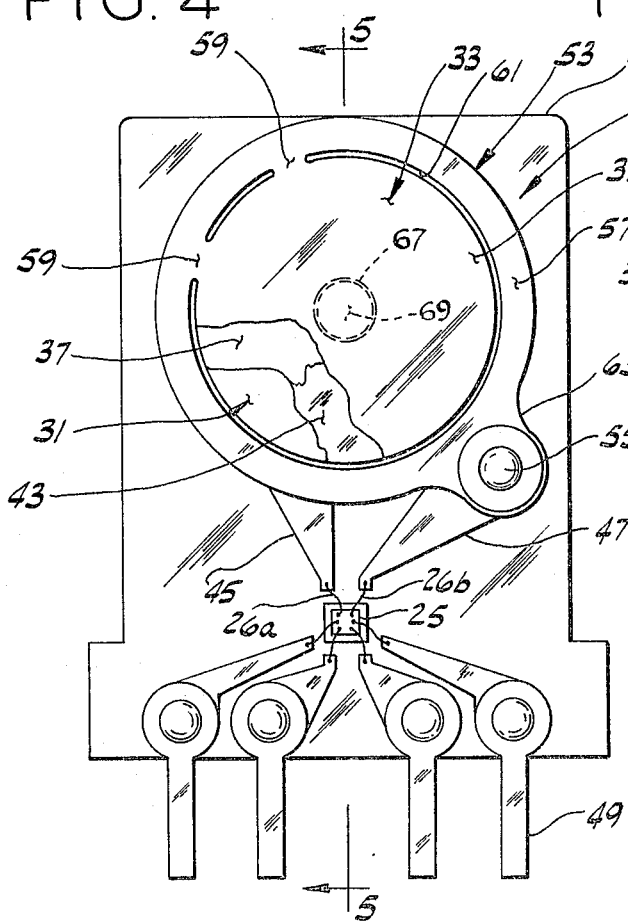
FIG. 4 is a view taken on line 4—4 of FIG. 1 with some parts omitted illustrating in plan the variable capacitor and an integrated circuit mounted on a lead frame.

A lead frame or substrate board 23 of a rigid insulative material, such as a synthetic resin material (e.g., phenolic) or a cast ceramic material (e.g., alumina), is secured in position within housing 3 adjacent body 9 of key 5. Preferably, lead frame 23 is a printed circuit board having a layer of conductive metal applied to selective areas on one or both faces thereof for purposes as will appear. As indicated at 25 in FIG. 4, an integrated circuit chip is secured to one face (i.e., to the outer face of the lead frame). This chip may have a variety of functions which need not be explained herein. Typically, a chip circuit is energized and deenergized by a change in capacitance applied to its input leads 26a, 26b (see FIG. 4). For example, the circuit may be energized by applying more than about 25 picofarads to its input leads and deenergized by lowering this capacitance below 25 picofarads. Of course, in any chip circuit there may be some hysteresis such that the circuit may require more than 25 picofarads to turn the chip on and less than 25 picofarads to turn the chip off. For purposes of this disclosure it will be assumed that the chip circuit may be reliably turned on by applying 40 picofarads and reliably turned off by applying 10 picofarads. Of course, it will be understood that other IC chips or other solidstate devices with different absolute on and off capacitance values may be used.

Figure 5:
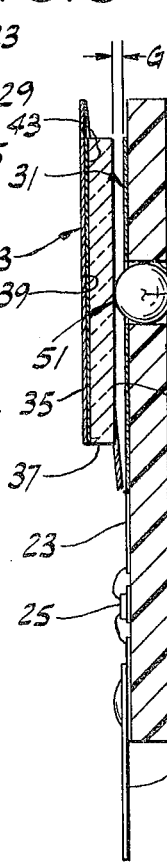
FIGS. 5 and 6 are vertical cross sectional views taken on line 5—5 of FIG. 4 respectively illustrating the variable capacitor in its first and second positions.
Figure 6:
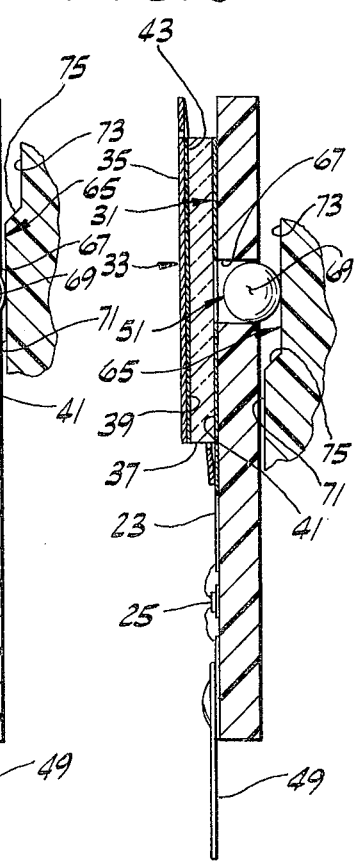

In accordance with this invention, a variable capacitor indicated generally at 29 is provided within housing 3. This capacitor has a stationary capacitor electrode 31 constituted by a layer of metal applied to lead frame 23 and another capacitor electrode 3 movable toward and away from the stationary electrode between a first position (as shown in FIGS. 1 and 5) in which the electrodes are separated from one another by an air gap G and a second position (FIGS. 2 and 6) in which the air gap is substantially eliminated for effecting a change of capacitance of the variable capacitor. For example, air gap G may have a thickness of about 0.03 inch (0.8 mm.). Electrodes 31 and 33 are generally circular and have the same capacitive area. For example, electrodes 31 and 33 may have a capacitive area of about 0.11 in.$^2$ (71 mm.$^2$). Thus, electrodes 31 and 33 constitute a pair of parallel circular capacitor plates. Movable electrode 33 is shown to comprise a plate 35 of a thin conductive metal and a circular pill-shaped wafer 37 of a rigid dielectric material secured to the side of plate 35 toward stationary electrode 31. This dielectric member has a dielectric constant substantially greater than air, its dielectric constant ranging between about 500 and 10,000 and preferably having a nominal value of about 4,000. Preferably, wafer 37 is made of a barium-titinate based ($BaTiO_3$) ceramic material of sufficient thickness to prevent bending or flexure of plate 35. The wafer has flat, parallel upper and lower surfaces 39 and 41, respectively, generally the same size as stationary electrode 31 and plate 35. Upper face 39 of the wafer has a layer of conductive metal 43 (see FIGS. 4-6) applied thereto to facilitate soldering or otherwise bonding this upper face to plate 35 and to insure good contact between wafer 37 and plate 35. As indicated at 45 and 47 (see FIG. 4), conductor paths are provided on board 23 for interconnecting their respective capacitor electrodes 31 and 33 to chip 25 via its input leads 26a, 26b. Also, board 23 has terminals 49 at one margin thereof extending down from the lead frame for connection of the output leads of chip 25 to other electronic devices (not shown). It will be understood that chip 25 need not be mounted within switching module 1, but that it may be located remote from the switching module (e.g., the chip may be a central chip in a pocket calculator and capacitor 29 may be interconnected to the remote chip via terminals similar to terminals 49). It will also be understood that while it is desirable that air gap G be eliminated entirely when electrode 33 is in its second position to effect a dramatic change in capacitance of capacitor 29, a small air gap (e.g., about 0.005 inch or 0.013 mm.) may be present when the electrodes are contiguous in their stated second position. Even with this small air gap present when the electrodes are in their second position, a sufficient change in capacitance of capacitor 29 may be effected to actuate the integrated circuit or other solid-state device connected to the switching module.

As indicated generally at 51, a ball cam coupled movable electrode 33 to actuating key 5 whereby upon movement of the key from its first to its second position, movable electrode 33 is moved via the ball cam from its first to its second position thereby to effect a sufficient change in capacitance of capacitor 29 so as to trigger IC chip 25, and upon movement of key 5 from its second to its first position, movable electrode 33 is positively moved back to its first position, thereby again to open air gap G and to effect another change of capacitance of capacitor 29 so as to thus cause the IC chip to be turned off. In other words, with key 5 and electrode 33 in their respective first positions, the capacitance applied to the input leads 26a, 26b of chip 25 is below its absolute "off" capacitance level (e.g., 10 picofarads) and with the key and capacitor in their second positions, the capacitance applied to the chip is far greater than the absolute "on" capacitance level (e.g., 40 picofarads) of the chip circuit.

Movable electrode 33 is resiliently secured to lead frame 33 by means of a unitary electrode and spring member 53 which is secured to the lead frame at one location, as by a rivet 55, in electric contact with conductor path 47. This unitary member is a one piece stamping of a relatively thin, resilient electrically conductive alloy, such as beryllium copper or the like, and it includes a center portion constituting electrode plate 35 and a resilient spring frame 57 surrounding the plate. The latter is secured to the spring frame at one locale by a pair of spaced mounting tabs 59 and is separated from the spring frame by a circular slot 61. With dielectric wafer 37 bonded to the face of plate 35 toward stationary electrode 31, the plate becomes stiff and will not flex except in the area of tabs 59. Thus, spring frame 57 biases movable electrode 33 toward engagement with stationary electrode 31 and insures that surface 41 of wafer 37 is maintained substantially parallel to the stationary electrode as the movable electrode is moved between its first and second positions. A mounting tab 63 on spring frame 57 substantially opposite tabs 59 receives rivet 55 for securing the frame to lead frame 23 in electrical contact with conductor path 47.

Ball cam 51 includes an axially movable cam generally indicated at 65 carried by body 9 of key 5 and movable therewith as the key moves axially between its first and second positions. This cam is shown to be in close proximity to the back face of the lead frame 23. The latter has an aperture 67 therethrough generally at the center of stationary electrode 31 for reception of a ball 69 preferably of an electrically insulative material which couples cam 65 and movable electrode 33 and thus constitutes a cam follower. This ball is movably received in aperture 67 and its diameter is somewhat greater than the thickness of lead frame 23. Cam 65 is shown to be an axially movable wedge cam having a first cam surface 71 spaced relative to lead frame 23 and stationary electrode 31 so that with ball 69 in engagement with cam surface 71, the ball projects beyond the outer surface of stationary electrode 31 and engages movable surface 41 of dielectric wafer 37 to maintain movable electrode 33 in its stated first position with air gap G between surface 41 of the dielectric member and the stationary electrode. Cam 65 has a second cam surface 73 spaced from stationary electrode 31 a distance somewhat greater than the diameter of the ball so that the ball in engagement with the second cam surface, the resilient bias of spring 53 biases the movable electrode 33 from its first to its second position thereby to substantially eliminate air gap G. Cam surfaces 71 and 73 are generally parallel to the longitudinal axis of key 5. The cam further includes a wedge or transition cam surface 75 between cam surfaces 71 and 73 engageable with ball 69 upon movement of key 5 between its first and second positions for effecting movement of the movable electrode between its first and second positions. It will be noted that upon return of key 5 from its second position (FIG. 2) to its first position (FIG. 1) under the bias of spring 13, ball 69 is positively forced outwardly relative to stationary electrode 31 by wedge cam surface 75 thereby to positively move the movable electrode from its second to its first position and to thus insure that air gap G is open between capacitor electrodes 31 and 33 to effect a change in capacitance on capacitor 29 and thus to turn off IC chip 25.

It will be understood that upon moving key 5 from its first to its second position, air gap G between electrodes 31 and 33 is eliminated, or essentially so, thus causing a dramatic change in capacitance of capacitor 29. For example, if air gap G is eliminated, the capacitance may increase 3 or more orders of magnitude. However, if the air gap is not entirely eliminated a great change in capacitance of capacitor 29 is nevertheless effected to trigger an integrated circuit or other solid-state device connected to and controlled by the switching module. Thus, if dust particles or other contaminants are present between electrodes 31 and 33 which prevent the air gap from being entirely eliminated, the switching module of this invention will still reliably perform its intended function.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. A switching module for a solid-state keyboard or the like comprising an actuating key manually movable between a first and a second position, a variable capacitor comprising a rigid stationary electrode and another electrode movable toward and away from said stationary electrode between a first position in which said electrodes are separated by an air gap and a second position in which said air gap is substantially eliminated for effecting a change in capacitance in said variable capacitor, said movable electrode having a rigid dielectric material secured thereto on its side toward said stationary electrode, said dielectric member having a dielectric constant substantially greater than air, biasing means comprising a unitary member of resilient electrically conductive metal having a plate portion constituting said movable electrode and a frame surrounding said plate portion and being secured thereto at one locale but being free of said plate portion elsewhere therearound for permitting movement of said plate portion relative to said frame, the latter being secured to a substrate opposite said one locale, and said module further comprising means coupling said actuating key and said movable electrode for effecting movement of said movable electrode and said dielectric member between its said first and second position in response to movement of said actuating key between its first and second positions.

2. A switching module as set forth in claim 1 wherein said substrate is a printed circuit board having other areas of conductive metal applied thereto for interconnection of said electrodes to other electrical or electronic devices.

3. A switching module as set forth in claim 2 for triggering an integrated circuit or the like, said module further comprising means interconnecting said electrodes to said integrated circuit for triggering said integrated circuit upon changes of the capacitance of said capacitor as said key is moved between its first and second positions.

4. A switching module as set forth in claim 1 wherein said movable electrode is a thin metal plate and said dielectric member is a wafer of ceramic dielectric material bonded to the face of said plate toward said stationary electrode, said wafer being sufficiently stiff so as to substantially maintain said plate flat.

5. A switching module as set forth in claim 4 wherein said ceramic material is a barium-titanate based dielectric material having a dielectric constant ranging between about 500 and 10,000.

6. A switching module as set forth in claim 5 wherein said dielectric member has a layer of conductive material applied to its face bonded to said plate.

7. A switching module as set forth in claim 1 further comprising a rigid insulative substrate having an area of conductive material on one face thereof, said area of conductive material constituting said stationary electrode.

8. A switching module as set forth in claim 7 wherein said dielectric member has a surface facing toward said stationary electrode, said surface being substantially parallel to said stationary electrode, and wherein said module further comprises means for maintaining said surface of said dielectric member substantially parallel to said stationary electrode as the movable electrode is moved between its first and second positions.

9. A switching module for a solid-state keyboard or the like comprising an actuating key manually movable between a first and a second position, a variable capacitor comprising a rigid stationary electrode and another electrode movable toward and away from said stationary electrode between a first position in which said electrodes are separated by an air gap and a second position in which said air gap is substantially eliminated for effecting a change in capacitance in said variable capacitor, said movable electrode having a rigid dielectric material secured thereto on its side toward said stationary electrode, said dielectric member having a dielectric constant substantially greater than air, and said module further comprising means coupling said actuating key and said movable electrode for effecting movement of said movable electrode and said dielectric member between its said first and second positions in response to movement of said actuating key between its first and second positions, said coupling means comprises cam means carried by said key, and cam follower means coupling said cam means and said movable electrode, said cam follower means being movable generally perpendicularly to said stationary electrode for effecting movement of said movable electrode between its first and second positions upon movement of said key between its first and second positions.

10. A switching module as set forth in claim 9 wherein said movable electrode is coupled to a substrate, said substrate has an aperture therethrough located generally at the center of an area of metal deposited on said substrate constituting said stationary electrode, and wherein said cam follower means comprises a ball received within said aperture, said ball being engageable with said cam means and with said movable electrode and being movable generally perpendicularly relative to said substrate upon movement of said cam means for effecting movement of said movable electrode between its first and second positions 11. A switching module as set forth in claim 10 wherein said cam means has a first cam surface spaced relative to said stationary electrode so that with said ball in engagement with said movable electrode and with said first cam surface said movable electrode is in its first position with said air gap between said movable and said stationary electrodes, a second cam surface spaced relative to said stationary electrode a distance greater than the diameter of said ball so that with said ball in engagement with said second cam surface said movable electrode may move to its second position thereby to substantially eliminate said air gap, and a transition cam surface between said first and second cam surfaces so that with said ball in engagement with said transition cam surface said movable electrode is moved between its first and second positions.

* * * * *